US010483873B2

(12) United States Patent
Tanabe et al.

(10) Patent No.: US 10,483,873 B2
(45) Date of Patent: Nov. 19, 2019

(54) POWER CONVERSION APPARATUS AND CONTROL METHOD OF INVERTER

(71) Applicant: OMRON Corporation, Kyoto (JP)

(72) Inventors: Katsutaka Tanabe, Moriyama (JP); Takao Mizokami, Ritto (JP); Takuji Kumagai, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/221,620

(22) Filed: Dec. 17, 2018

(65) Prior Publication Data

US 2019/0280616 A1 Sep. 12, 2019

(30) Foreign Application Priority Data

Mar. 8, 2018 (JP) ................. 2018-041795

(51) Int. Cl.
*H02M 7/48* (2007.01)
*H02M 7/5387* (2007.01)
*H02M 7/5395* (2006.01)
*H02H 7/122* (2006.01)
*H03K 17/082* (2006.01)

(52) U.S. Cl.
CPC ........ *H02M 7/53871* (2013.01); *H02H 7/122* (2013.01); *H02M 7/5395* (2013.01); *H03K 17/0828* (2013.01); *H03K 2217/0027* (2013.01)

(58) Field of Classification Search
CPC .. H02M 1/32; H02M 7/53871; H02M 7/5395; H02H 7/1225; H02H 7/122; H03K 17/0828

USPC .......... 363/17, 20, 37, 56.05, 58, 95, 96, 98, 363/132; 327/109, 309, 314, 376, 379, 327/432, 502; 361/81, 91.5, 92
See application file for complete search history.

(56) References Cited

U.S. PATENT DOCUMENTS

| 5,625,539 A * | 4/1997 | Nakata | H02M 7/4807 363/132 |
| 7,075,762 B2 * | 7/2006 | Iimura | H02H 7/122 361/18 |
| 8,184,461 B2 * | 5/2012 | Mabuchi | H02J 3/383 363/124 |
| 9,190,920 B2 * | 11/2015 | Zhang | H02M 3/33569 |

(Continued)

FOREIGN PATENT DOCUMENTS

| CN | 102545620 | 7/2012 |
| CN | 202841051 | 3/2013 |

(Continued)

OTHER PUBLICATIONS

Office Action of Taiwan Counterpart Application, with English translation thereof, dated Jul. 18, 2019, pp. 1-9.

*Primary Examiner* — Rajnikant B Patel
(74) *Attorney, Agent, or Firm* — JCIPRNET

(57) ABSTRACT

A power conversion apparatus includes an inverter for drive controlling a plurality of switching elements, drive circuits, a control circuit, a current detection part, an overcurrent detection circuit, and a protection circuit. The protection circuit, which receives a detection signal that the overcurrent detection circuit outputs to indicate detection of overcurrent, outputs a signal to the drive circuits for turning off a switching element that has been turned on by a control signal from the control circuit for a predetermined time.

4 Claims, 6 Drawing Sheets

(56) References Cited

U.S. PATENT DOCUMENTS

| | | | | |
|---|---|---|---|---|
| 2013/0106470 A1* | 5/2013 | Takagiwa | ............ | H03K 17/168 327/109 |
| 2014/0043867 A1* | 2/2014 | Sugawara | ......... | H02M 3/33507 363/21.15 |
| 2018/0234088 A1* | 8/2018 | Narayanasamy | ............................ | H03K 17/08122 |

FOREIGN PATENT DOCUMENTS

| | | |
|---|---|---|
| CN | 105340163 | 2/2016 |
| JP | 2013198185 | 9/2013 |
| TW | 201037961 | 10/2010 |

\* cited by examiner

POWER CONVERSION APPARATUS AND CONTROL METHOD OF INVERTER

CROSS-REFERENCE TO RELATED APPLICATION

This application claims the priority benefit of Japan Patent Application No. 2018-041795, filed on Mar. 8, 2018. The entirety of the above-mentioned patent application is hereby incorporated by reference herein and made a part of this specification.

BACKGROUND

Technical Field

The disclosure relates to a power conversion apparatus that changes direct current (DC) power into alternating current (AC) power and a control method of an inverter.

Description of Related Art

Conventionally, a power conversion apparatus as shown in FIG. 4 has been proposed in order to protect an inverter from overcurrent. FIG. 4 shows a power conversion apparatus 100, which includes a full-bridge inverter composed of four insulated gate bipolar transistors (IGBTs) 105-1 to 105-4 having free-wheeling diodes as an example of switching elements. Drive circuits 108-1 to 108-4 each having a DESAT (desaturation protection) function are connected to the gates of the respective IGBTs. Each of the IGBTs 105-1 to 105-4 is driven according to a pulse width modulation (PWM) signal outputted from a control circuit 111 of the power conversion apparatus to each of the drive circuits 108-1 to 108-4, thereby performing power conversion. In the drive circuits 108-1 to 108-4 having the DESAT function, overcurrent is detected by the rise of an on-voltage drop (Vse(sat)) caused by a collector current when the IGBTs 105-1 to 105-4 are on, a gate drive signal is stopped, and a FAULT signal is sent to the control circuit 111 to stop the output of the PWM signal (refer to Patent Document 1). However, such drive circuits 108-1 to 108-4 incur higher cost for having the DESAT function. Furthermore, it is also necessary for the drive circuits 108-1 to 108-4 to be tuned according to the characteristics of the IGBT so as not to cause malfunction while the design flexibility is also restricted.

In addition, a power conversion apparatus 200 as shown in FIG. 5 has been proposed as a conventional example using a lower-cost general-purpose drive circuit which does not have the DESAT function, in which a current detection sensor 209, such as a current transformer (CT), for detecting a current inputted into an inverter 204 is provided, and overcurrent is detected by the current detection sensor 209. Also, an overcurrent detection circuit 210 for detecting overcurrent using the output of the current detection sensor 209 is provided. Furthermore, a gate integrated circuit (IC) circuit 212 is provided between a control circuit 211 and each of the drive circuits 208-1 to 208-4. The gate IC circuit 212 has functions of outputting the PWM signal outputted from the control circuit 211 to each of the drive circuits 208-1 to 208-4 and outputting a signal for stopping gate drive of each of the drive circuits 208-1 to 208-4. When overcurrent is detected in the overcurrent detection circuit 210, a gate block signal is outputted from the overcurrent detection circuit 210 to the gate IC circuit 212 and the control circuit 211. The gate IC circuit 212 receiving the gate block signal outputs a signal for stopping the gate drive collectively to each of the drive circuits 208-1 to 208-4. In addition, the control circuit 211 which has received the gate block signal stops the output of the PWM signal. Furthermore, a power conversion apparatus 300 has also been proposed, which realizes the operation of the gate IC circuit in the power conversion apparatus 200 above using software of a control circuit 311 when the overcurrent detection circuit 210 detects overcurrent, as shown in FIG. 6.

Here, in the conventional power conversion apparatus as described above, when overcurrent is detected and the operation of the gate is stopped, if the IGBT is turned off based on the gate block signal in a short time after it is turned on, since parasitic inductance exists in the wiring connected to the IGBT, an overvoltage is generated at both terminals of the IGBT and there is a possibility that the switching element such as the IGBT may malfunction. That is, there may be a problem that the switching element malfunctions due to the protection operation against overcurrent.

RELATED ART

Patent Document

[Patent Document 1] Japanese Laid-open No. 2013-198185

SUMMARY

The disclosure provides a power conversion apparatus, including: an inverter including a plurality of legs constituted by a pair of switching elements connected in series and converting DC power into AC power by drive controlling a plurality of the switching elements; a plurality of drive circuits driving the plurality of the switching elements; a control circuit outputting a control signal of the plurality of the switching elements; a current detection part detecting a direct current inputted to the inverter; an overcurrent detection circuit detecting overcurrent based on a current detected by the current detection part; and a protection circuit provided between the control circuit and the plurality of drive circuits, wherein the overcurrent detection circuit outputs a detection signal indicating detection of overcurrent in the protection circuit when detecting overcurrent, and the protection circuit receiving the detection signal outputs to the plurality of drive circuits a signal for turning off a switching element which has been turned on by the control signal from the control circuit for a predetermined time.

Furthermore, the disclosure provides a control method of an inverter including a plurality of legs constituted by a pair of switching elements connected in series and converting DC power into AC power by drive controlling a plurality of the switching elements. The control method includes: turning off a switching element which has been turned on for a predetermined time when overcurrent inputted to the inverter is detected.

DESCRIPTION OF THE EMBODIMENTS

The disclosure provides a power conversion apparatus with highly reliable control when overcurrent occurs and a control method of an inverter.

According to the disclosure, when overcurrent occurs due to erroneous ignition, etc. of the switching element that has been turned off among a pair of switching elements constituting a leg, the other switching element which is turned on and operating normally can be turned off so as to prevent an excessive current from flowing into the switching element. Furthermore, when overcurrent occurs, since the switching element which has been turned on for a predetermined time is turned off, occurrence of overvoltage due to turning off of the switching element that has just been turned on can be prevented, and it is possible to realize highly reliable control without causing the switching element to malfunction in order to reduce the influence of overcurrent. Here, the switching element performs on/off switching for power conversion of the inverter. The switching element may be, for example, IGBT, MOS-FET, SiC, GaN, or a transistor.

Furthermore, in the disclosure, the protection circuit receiving the detection signal may output to the plurality of drive circuits an exclusive logical sum (exclusive OR) of the control signal and a logical product (AND) of the control signal delayed by the predetermined time and the detection signal.

Accordingly, highly reliable control can be realized using a simple configuration. The logical product can be calculated using an AND logic circuit. Also, the exclusive logical sum can be calculated using an XOR logic circuit.

Furthermore, in the disclosure, the protection circuit may include a RC circuit delaying the control signal by the predetermined time.

Accordingly, since the predetermined time of delay can be appropriately set by the resistance value of the resistor and the capacitance of the capacitor constituting the RC circuit, the design flexibility is high.

According to the disclosure, when overcurrent inputted to the inverter occurs, the switching element which has been turned on for the predetermined time is turned off. As such, occurrence of overvoltage due to turning off of the switching element that has just been turned on can be prevented, and it is possible to realize highly reliable control without causing the switching element to malfunction in order to reduce the influence of overcurrent.

According to the disclosure, the power conversion apparatus and the control method of the inverter achieve highly reliable control when overcurrent occurs.

Application Example

Figure 1:
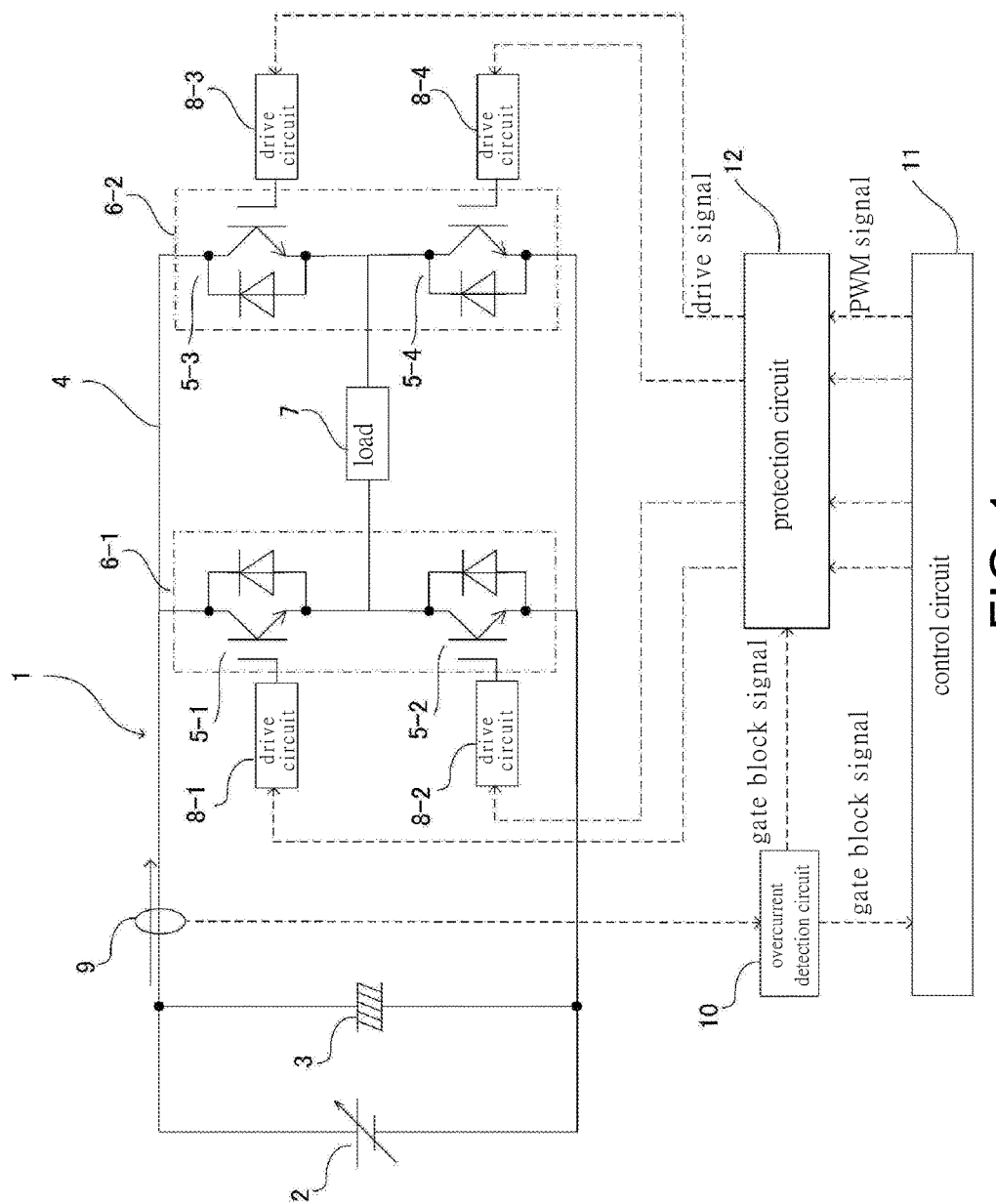
FIG. 1 is an overall configuration diagram of a power conversion apparatus according to an embodiment of the disclosure.

Hereinafter, an example of application of the disclosure will be described with reference to the drawings. The disclosure is applied, for example, to a power conversion apparatus 1 provided with a full-bridge inverter 4 having two legs as shown in FIG. 1. When an overcurrent detection circuit 10 detects the occurrence of overcurrent from an output of a current detection sensor 9, with respect to a gate turn-off signal outputted from the overcurrent detection circuit 10, a protection circuit 12 outputs a drive signal to the drive circuit for turning off only the IGBT which has been turned on for a predetermined time among the IGBTs that are turned on by a PWM signal from a control circuit 11 and are operating normally. In this way, it is possible to prevent the occurrence of an excessive voltage at both terminals of the IGBT due to turning off of the IGBT immediately after it is turned on, and to perform reliable control when overcurrent occurs.

Embodiment

Hereinafter, a power conversion apparatus according to embodiments of the disclosure will be described in more details with reference to the drawings.

[Apparatus Configuration]

FIG. 1 is a block diagram showing an overall configuration of a power conversion apparatus according to the embodiment.

As shown in FIG. 1, a power conversion apparatus 1 according to the embodiment includes an inverter 4 for converting a DC voltage inputted from a variable power source 2 via a rectifier circuit 3 into an AC voltage. The inverter 4 includes a leg 6-1 composed of IGBTs 5-1 and 5-2 having freewheeling diodes, which are an example of a pair of switching elements on the upper and lower arms; and a similar leg 6-2 composed of IGBTs 5-3 and 5-4 having freewheeling diodes on the upper and lower arms, and the inverter 4 adopts a full-bridge configuration in which a load 7 is connected between output terminals of the respective legs. The configuration is not limited to two legs as shown in the drawing, and a configuration having three or more legs is possible.

Also, drive circuits 8-1 to 8-4 are provided respectively at the gates of the IGBTs 5-1 to 5-4. On the positive electrode side of a variable power supply 2 connected to the inverter 4, a CT sensor 9, which is an example of a current detection part for detecting a current, is provided. The output of the CT sensor 9 is inputted to an overcurrent detection circuit 10. Furthermore, a control circuit 11 for controlling the inverter 4 is provided, and a protection circuit 12 is provided between the control circuit 11 and each of the drive circuits 8-1 to 8-4. The control circuit 11 complementarily drive controls a pair of IGBTs constituting each leg. That is, the IGBT 8-1 and the IGBT 8-2 are drive controlled to alternately repeat on and off, and either one or both of the IGBT 8-1 and the IGBT 8-2 has or have to be turned off. In addition, power conversion is performed by on/off control (switching) of the IGBT according to a duty ratio of the PWM signal outputted from the control circuit 11.

When the overcurrent detection circuit 10 detects overcurrent, a gate block signal, which is a detection signal indicating the detection of overcurrent, is outputted toward the protection circuit 12 and the control circuit 11.

Figure 2:
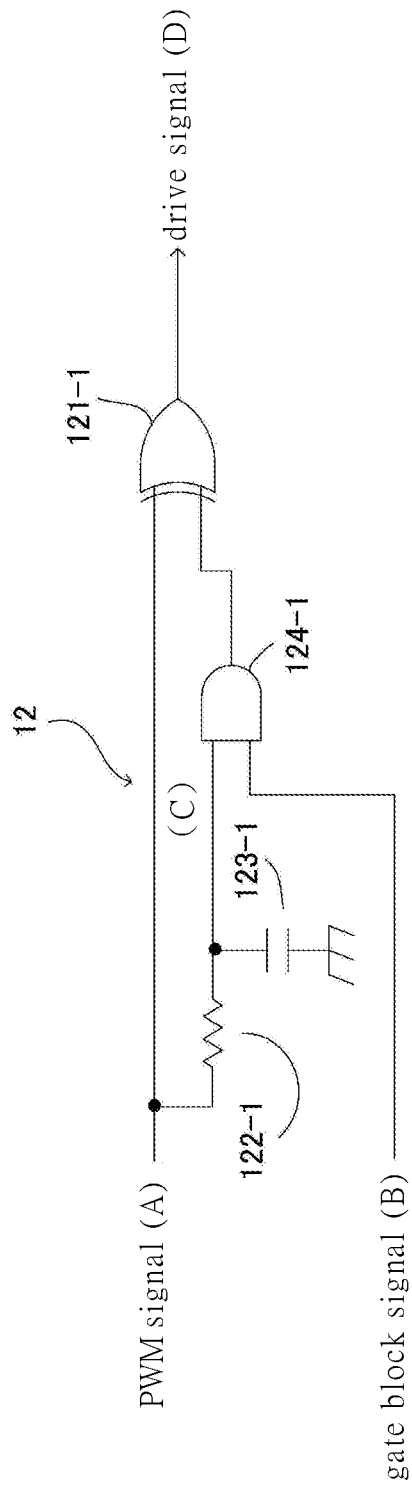
FIG. 2 is a circuit diagram of a portion of a protection circuit according to an embodiment of the disclosure.

Specifically, the protection circuit is configured as shown in FIG. 2. Firstly, a signal line (A) of the PWM signal, which is the control signal of each IGBT inputted from the control circuit 11, is connected to one of the input terminals of an XOR logic circuit 121-1 which performs an exclusive logical sum calculation, and the signal line (A) branches and is connected to one of the input terminals of an AND logic circuit 124-1 which performs a logical product calculation via a capacitor 123-1 connected in parallel between the resistor 122-1 and the ground that are connected in series. A time constant of the RC circuit composed of the resistor 122-1 and the capacitor 123-1 can be appropriately set by the resistance value of the resistor 122-1 and the capacitance of the capacitor 123-1. Also, the signal line (B) of the gate block signal outputted from the overcurrent detection circuit 10 is connected to the other input terminal of the AND logic circuit 124-1. Then, the output terminal of the AND logic circuit 124-1 is connected to the other input terminal of the XOR logic circuit 121-1. Furthermore, a drive signal is outputted from the output terminal of the XOR logic circuit 121-1 to the drive circuit 8-1. Here, the operation of the protection circuit 12 will be described using the configuration for outputting the drive signal to the drive circuit 8-1 as an example.

The logic of each signal line is shown in Table 1.

TABLE 1

| Status | PWM signal (A) | RC output signal (B) | Overcurrent detection signal (C) | SW element drive signal (D) | State of gate |
|---|---|---|---|---|---|
| 1 | L(OFF) | L | L | L(OFF) | Operate |
| 2 | H(ON) | L | L | H(ON) | Operate |
| 3 | H | H(after time constant) | L | H(ON) | Operate |
| 4 | H | H(after time constant) | H(with overcurrent) | L(OFF) | Gate block |
| 5 | H | L | H(with overcurrent) | H(ON) | Operate |

Firstly, in Status 1, the PWM signal is LOW (hereinafter abbreviated as "L"), that is, gate OFF is instructed as turning off of the IGBT 5-1. Accordingly, the RC output signal shown in (B) is also L. At this time, the overcurrent detection signal is L, that is, no overcurrent is detected. Then, in Status 1, since the AND calculation result of (B) and (C) is L and the XOR calculation result of the L and (A) is also L, L of the PWM signal is directly shown as the drive signal in the signal line (D).

Next, in Status 2, the PWM signal is HIGH (hereinafter abbreviated as "H"), that is, gate ON is instructed as turning on of the IGBT. At this time, since it takes the time (time constant) for charging the capacitor from when the PWM signal becomes H to when the RC output signal becomes H, the RC output signal remains to be L until the time constant passes. If no overcurrent is detected, the overcurrent detection signal is L. Then, since the AND calculation result of (B) and (C) is L and the XOR calculation result of the L and (A) is H, H of the PWM signal is directly shown as the drive signal in the signal line (D).

Next, in Status 3, the PWM signal remains H, but when the time constant has passed after the PWM signal becomes H, the RC output signal becomes H. If no overcurrent is detected, the overcurrent detection signal is L. Then, since the AND calculation result of (B) and (C) is L and the XOR calculation result of the L and (A) is H, H of the PWM signal is directly shown as the drive signal in the signal line (D).

Next, in Status 4, the PWM signal is H, the time constant has passed after the PWM signal becomes H and the RC output signal is H. At this time, overcurrent is detected and the overcurrent detection signal becomes H. Then, since the AND calculation result of (B) and (C) is H and the XOR calculation result of the H and (A) is L, L is shown as the drive signal in the signal line (D), that is, a drive signal for turning off the gate is outputted.

Next, in Status 5, the PWM signal is H and the RC output is L. At this time, overcurrent is detected and the overcurrent detection signal becomes H. Then, since the AND calculation result of (B) and (C) is L and the XOR calculation result of the L and (A) is H, H of the PWM signal is directly shown as the drive signal in the signal line (D).

Figure 3:
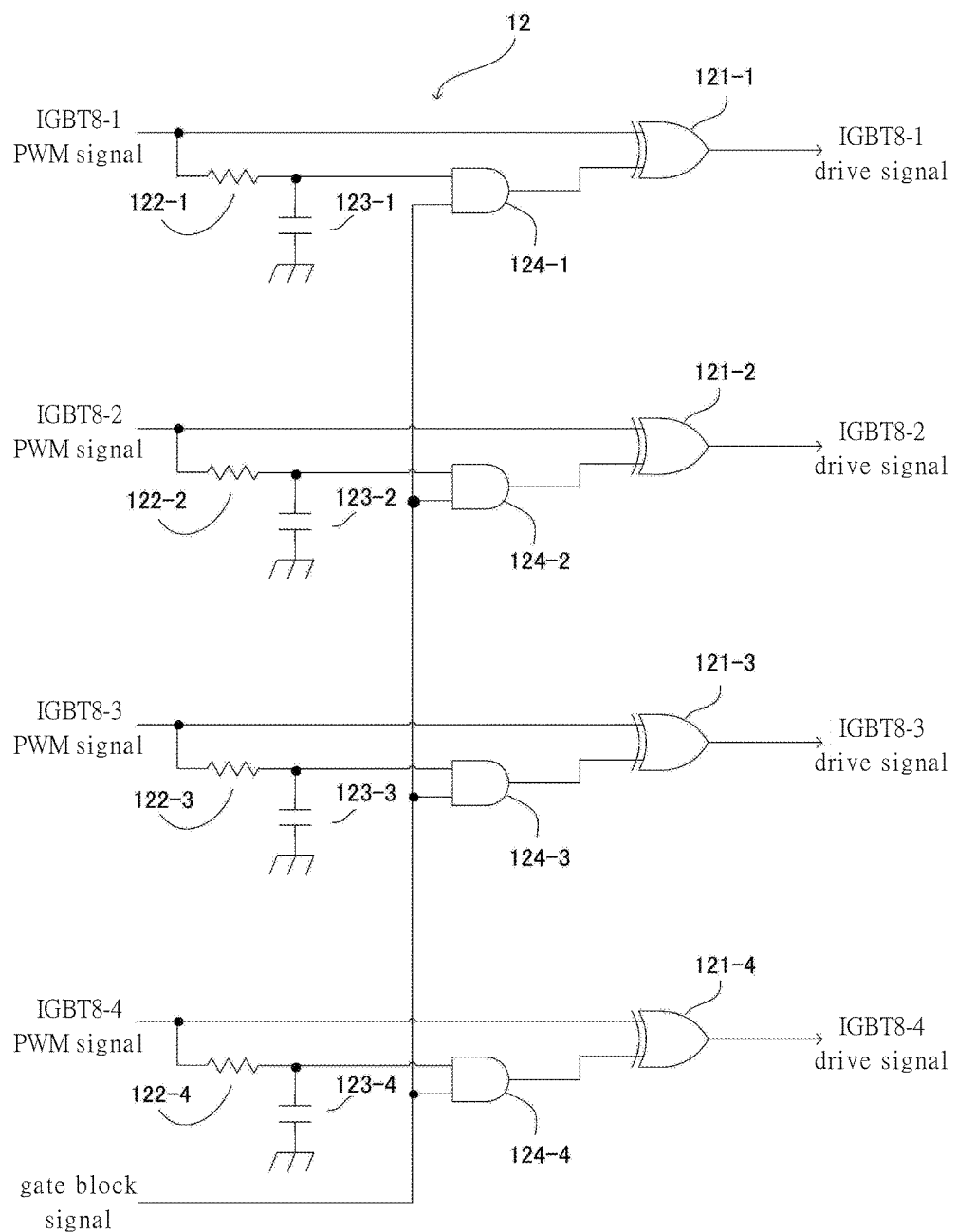
FIG. 3 is a circuit diagram showing an overall configuration of a protection circuit according to an embodiment of the disclosure.
Figure 4:
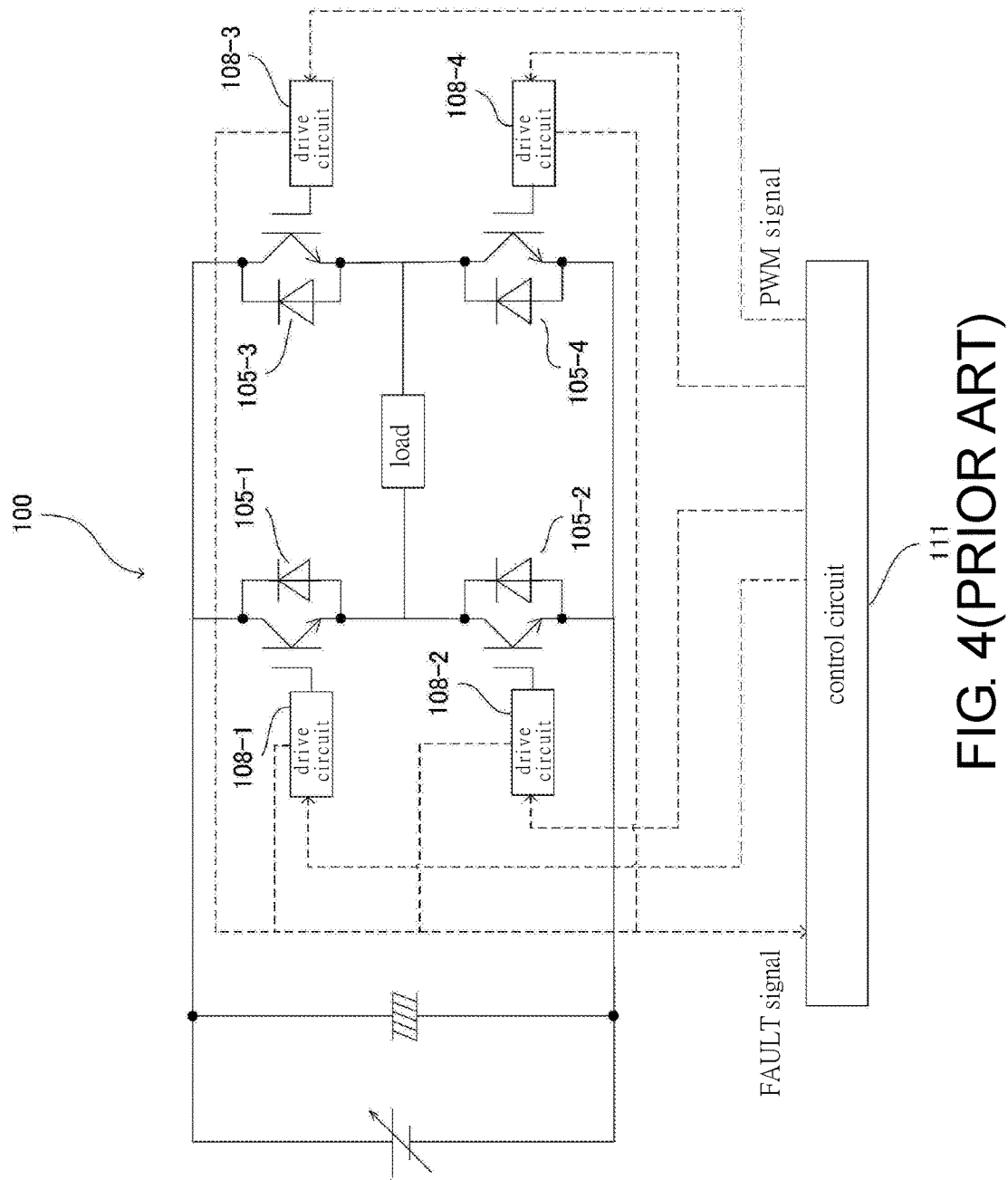
FIG. 4 is an overall configuration diagram of a power conversion apparatus according to a conventional example of the disclosure.
Figure 5:
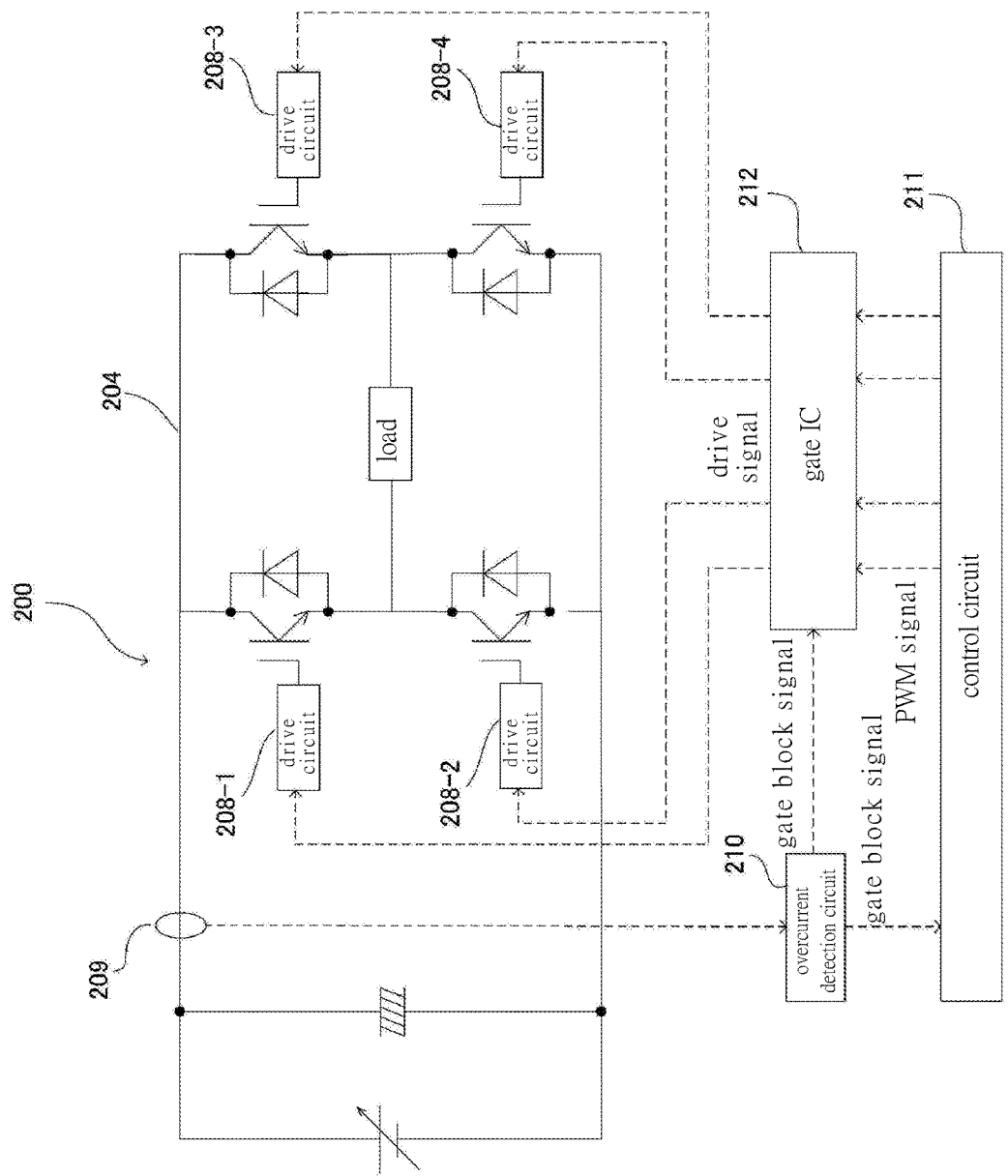
FIG. 5 is an overall configuration diagram of a power conversion apparatus according to another conventional example of the disclosure.
Figure 6:
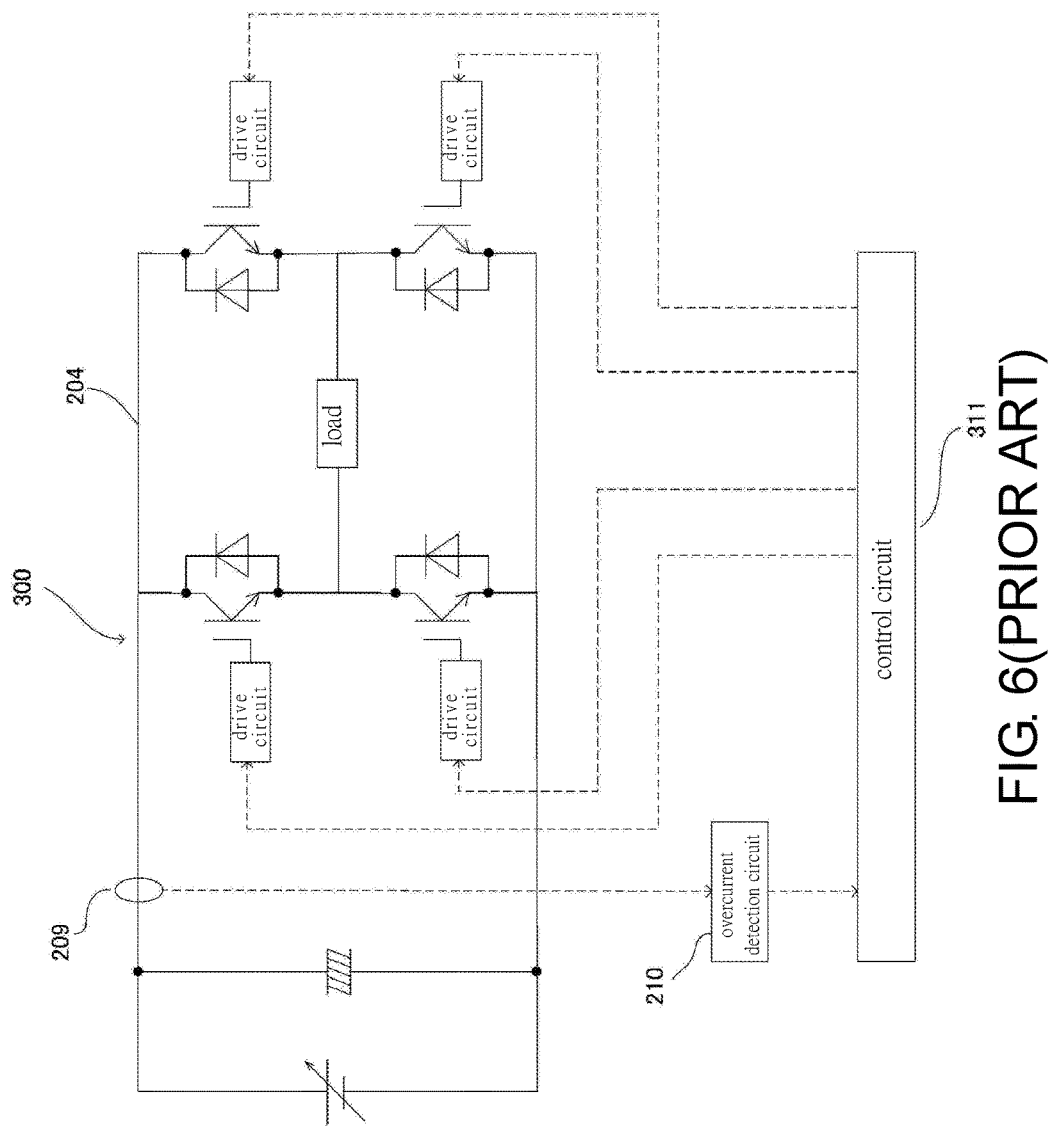
FIG. 6 is an overall configuration diagram of a power conversion apparatus according to yet another conventional example of the disclosure.

An overall configuration of the protection circuit 12 is shown in FIG. 3. The signal line of the gate block signal outputted from the overcurrent detection circuit 10 is communal. The PWM signal for controlling each of the IGBTs 5-1 to 5-4 is inputted from the control circuit 11 and the drive signals of the IGBTs 5-1 to 5-4 are outputted respectively to the drive circuits 8-1 to 8-4 from the protection circuit 12.

As such, according to the power conversion apparatus of the embodiment, when overcurrent occurs, even if off-control is performed on the IGBTs which are operating normally, that is, the IGBTs which have been turned on, only the IGBT that has been turned on for the predetermined time is controlled to be off. Therefore, malfunction of the IGBT due to heating, etc. caused by overvoltage is prevented, and it is possible to reduce the influence of overcurrent and achieve a more reliable control. Moreover, through improvement of characteristics of the switching elements, under the present situation that short-circuit tolerance of IGBTs is decreasing, the IGBTs can be stopped at high speed without a load using a hardware configuration called the protection circuit. Furthermore, since the time constant of the RC circuit, which determines the delay time for gate blocking the normally operating IGBT, can be appropriately set by the resistance value of the resistor and the capacitance of the capacitor, the design flexibility is high. In addition, the protection circuit can be configured using a simple configuration of an XOR logic circuit, an AND logic circuit, and a RC circuit, and the cost can be reduced. Also, since an IC including a plurality of XOR logic circuits 121-1 to 121-4 and an IC including a plurality of AND logic circuits 124-1 to 124-4 can be prepared, the protection circuit 12 can be realized by adding these few components. Moreover, the control method of an inverter according to the embodiment can be realized by software executed in the control circuit instead of the hardware configuration of the protection circuit.

Hereinafter, for comparison between the constituent elements of the disclosure and the configuration of the embodiment, the constituent elements of the disclosure are described with the reference numerals in the drawings.

<Disclosure 1>

A power conversion apparatus 1, comprising:

an inverter 4 comprising a plurality of legs (6-1, 6-2) constituted by a pair of switching elements (5-1, 5-2 and 5-3, 5-4) connected in series and converting DC power into AC power by drive controlling a plurality of the switching elements (5-1, 5-2 and 5-3, 5-4);

a plurality of drive circuits (8-1 to 8-4) driving the plurality of the switching elements (5-1, 5-2 and 5-3, 5-4);

a control circuit 11 outputting a control signal of the plurality of the switching elements (5-1, 5-2 and 5-3, 5-4);

a current detection part 9 detecting a direct current inputted to the inverter 4;

an overcurrent detection circuit 10 detecting overcurrent based on a current detected by the current detection part 9; and a protection circuit 12 provided between the control circuit 11 and the plurality of drive circuits (8-1 to 8-4), wherein the overcurrent detection circuit 10 outputs a detection signal indicating detection of overcurrent in the protection circuit 12 when detecting overcurrent, and the protection circuit 12 receiving the detection signal outputs to the plurality of drive circuits (8-1 to 8-4) a signal for turning off a switching element (5-1, 5-2 and 5-3, 5-4)

which has been turned on by the control signal from the control circuit 11 for a predetermined time.

<Disclosure 2>

The power conversion apparatus according to Disclosure 1, wherein the protection circuit (12) receiving the detection signal outputs to the plurality of drive circuits (8-1) an exclusive logical sum (121-1) of the control signal and a logical product (124-1) of the control signal delayed by the predetermined time and the detection signal.

<Invention 3>

The power conversion apparatus according to Disclosure 2, wherein the protection circuit (12) comprises a RC circuit (122-1, 123-1) delaying the control signal by the predetermined time.

<Disclosure 4>

A control method of an inverter 4 comprising a plurality of legs (6-1, 6-2) constituted by a pair of switching elements (5-1, 5-2 and 5-3, 5-4) connected in series and converting DC power into AC power by drive controlling a plurality of the switching elements (5-1, 5-2 and 5-3, 5-4), the control method comprising:

turning off a switching element (5-1, 5-2 and 5-3, 5-4) which has been turned on for a predetermined time when overcurrent inputted to the inverter 4 is detected.

What is claimed is:

1. A power conversion apparatus, comprising:
    an inverter comprising a plurality of legs constituted by a pair of switching elements connected in series and converting DC power into AC power by drive controlling a plurality of the switching elements;
    a plurality of drive circuits driving the plurality of the switching elements;
    a control circuit outputting a control signal of the plurality of the switching elements;
    a current detection part detecting a direct current inputted to the inverter;
    an overcurrent detection circuit detecting overcurrent based on a current detected by the current detection part; and
    a protection circuit provided between the control circuit and the plurality of drive circuits,
    wherein the overcurrent detection circuit outputs a detection signal indicating detection of overcurrent to the protection circuit when detecting overcurrent,
    wherein the protection circuit receives the detection signal,
    wherein the protection circuit outputs to the plurality of drive circuits a signal for turning off a switching element when the switching element has been turned on by the control signal from the control circuit for at least a predetermined time,
    wherein the protection circuit delays the output of the signal for turning off the switching element when the switching element has been turned on for less than the predetermined time, and outputs the signal for turning off the switching element when the switching element has been turned on for the predetermined time.

2. The power conversion apparatus according to claim 1, wherein the protection circuit receiving the detection signal outputs to the plurality of drive circuits an exclusive logical sum of the control signal and a logical product of the control signal delayed by the predetermined time and the detection signal.

3. The power conversion apparatus according to claim 2, wherein the protection circuit comprises a RC circuit delaying the control signal by the predetermined time.

4. A control method of an inverter comprising a plurality of legs constituted by a pair of switching elements connected in series and converting DC power into AC power by drive controlling a plurality of the switching elements, the control method comprising:

turning off a switching element when the switching element has been turned on for at least a predetermined time when overcurrent inputted to the inverter is detected, delaying turning off the switching element when the switching element has been turned on for less than the predetermined time when overcurrent inputted to the inverter is detected, and turning off the switching element when the switching element has been turned on for the predetermined time.

* * * * *